(12) United States Patent
Yun et al.

(10) Patent No.: US 6,664,595 B1
(45) Date of Patent: Dec. 16, 2003

(54) POWER MOSFET HAVING LOW ON-RESISTANCE AND HIGH RUGGEDNESS

(75) Inventors: Chong-man Yun, Seoul (KR); Tae-hoon Kim, Kyungki-do (KR)

(73) Assignee: Fairchild Korea Semiconductor Ltd., Buchun (KR)

( * ) Notice: Subject to any disclaimer, the term of this patent is extended or adjusted under 35 U.S.C. 154(b) by 0 days.

(21) Appl. No.: 09/533,816

(22) Filed: Mar. 24, 2000

(30) Foreign Application Priority Data

Mar. 26, 1999 (KR) ........................................ 1999-10512

(51) Int. Cl.[7] .............................................. H01L 29/76
(52) U.S. Cl. ........................ 257/342; 257/341; 257/401
(58) Field of Search ................................ 257/335–342, 257/341, 401; 438/268–274

(56) References Cited

U.S. PATENT DOCUMENTS

| 4,639,754 | A | * | 1/1987 | Wheatley, Jr. et al. ...... 357/23.4 |
| 4,642,666 | A | | 2/1987 | Lidow et al. |
| 4,860,072 | A | | 8/1989 | Zommer |
| 4,959,699 | A | | 9/1990 | Lidow et al. |
| 5,378,911 | A | * | 1/1995 | Murakami .................... 257/334 |
| 5,654,562 | A | * | 8/1997 | Fragale et al. ............... 257/164 |

FOREIGN PATENT DOCUMENTS

JP  5-273583  * 10/1993

* cited by examiner

Primary Examiner—Ori Nadav
(74) Attorney, Agent, or Firm—Volentine Francos, PLLC

(57) ABSTRACT

A power MOSFET is provided. In this power MOSFET, a drift region is formed on a drain region having the same conductivity type as that of the drain region using a semiconductor substrate of a first conductivity type. A gate electrode is formed on the drift region, having a plurality of openings spaced apart from each other by a predetermined distance. The plurality of openings partially expose the drift region, and a gate insulating layer is interposed between the gate electrode and the drift region. A body region of a second conductivity type opposite to the first conductivity type is formed on a predetermined upper region of the drift region and extends from the opening to have a side overlapped by the gate electrode. A channel in the portion of the body region overlapped by the gate electrode is not formed and is adjacent to at least two facing sides of the opening. A source region is formed in the body region, including a first source region shaped in the form of a strip, the first source region contacting a portion where a channel is formed, and a second source region connecting the first source regions facing to each other. Also, a source electrode is electrically connected to the source region, and a drain electrode is electrically connected to the drain region.

11 Claims, 9 Drawing Sheets

+ : p-TYPE IMPURITY IONS

+ : p-TYPE IMPURITY IONS

+ : p-TYPE IMPURITY IONS

POWER MOSFET HAVING LOW ON-RESISTANCE AND HIGH RUGGEDNESS

This application relies for priority upon Korean Patent Application No. 99-10512, filed on Mar. 26, 1999, the contents of which are herein incorporated by reference in their entirety.

BACKGROUND OF THE INVENTION

The present invention relates to a power MOS field effect transistor (a power MOSFET) and a manufacturing method thereof. More particularly the present invention relates, to a power MOSFET having a low on-resistance and high ruggedness, and to a manufacturing method thereof.

Compared to a bipolar transistor, a typical power MOSFET has a low input impedance, a high switching speed, and an excellent safe operating region. However, the power MOSFET also includes a parasitic bipolar transistor. When this parasitic bipolar transistor is turned on, a device is latched into the ON-state and thus may be damaged.

There have been various methods proposed for suppressing the turning-on of the parasitic bipolar transistor, and the method of forming an emitter ballast resistance is typical. By this method, the movement of current flowing through a source contact in an $n^+$-type source region is lengthened, thus increasing the potential in an $n^+$-type source region, and reducing the potential difference across a junction between the $n^+$-source region and a $p^-$-type body region. This suppresses the turning-on of the parasitic bipolar transistor.

FIG. 1 is a cell layout of a conventional power MOSFET in which an emitter ballast resistance is formed to suppress the turning-on of a parasitic bipolar transistor.

Referring to FIG. 1, a gate electrode 10 has a predetermined opening 5. A $p^-$ type body region 11 is an inner region indicated by dotted lines, and is formed by ion implantation and diffusion processes using the gate electrode as a mask. An $n^+$-type source region 12 includes tetragonal side regions in a predetermined surface region of the $p^-$ type body region 11. Also, the $n^+$-type source region 12 includes a contact region for connecting the source region 12 with a source electrode.

In this conventional power MOSFET, current partially flows along the side regions of the $n^+$-type source region 12 to a source contact 13 via the contact region. Thus, the length of the $n^+$-type source region 12 in which current moves is longer than that of the conventional power MOSFET in which all regions of the $n^+$-type source region 12 contacts the source electrode, to thereby increase the size of the voltage drop. As a result, the potential difference between the $n^+$-type source region 12 and the $p^-$ type body region 11 is decreased, to suppress the turning-on of a parasitic bipolar transistor.

In the power MOSFET described above, $n^+$-type source regions are sequentially formed around the $p^-$-type body region 11, and so parasitic bipolar transistors exist sequentially around the $p^-$ type body region 11. As a result, the turning-on of the parasitic bipolar transistor can be suppressed by the emitter ballast resistance, which is limited due to an increase in the density of the parasitic bipolar transistor. Also, the paths in which the current moves in the $n^+$-type source region 12 are divided, so that the emitter ballasting effect may be decreased.

To solve the above problems, the integration density of the parasitic bipolar transistor must be reduced. However, this also reduces the density of the channel, which can increase the on-resistance and the size of the device. Thus, there is a trade-off between the ruggedness capable of sufficiently suppressing turn-on of the parasitic bipolar transistor and low on-resistance.

SUMMARY OF THE INVENTION

It is an object of the present invention to provide a power MOSFET in which the structures of a body region and a source region are changed to thereby obtain low on-resistance and high ruggedness.

It is another object of the present invention to provide a method for manufacturing a power MOSFET having a low on-resistance and high ruggedness.

Accordingly, to achieve the first object, a power MOSFET that comprises a drain region formed of a semiconductor substrate of a first conductivity type, a drift region formed on the drain region, having the same conductivity type as the drain region, a gate insulating layer on the drift region, having a plurality of openings spaced apart from each other by a predetermined distance, the plurality of openings partially exposing the drift region, a gate electrode formed on the gate insulating layer, a plurality of body regions of a second conductivity type, each body region being formed in the drift region beneath a corresponding opening and having a plurality of side portions overlapped by the gate electrode, wherein at least two first side portions have a channel formed in them, and at least two second side portions do not have a channel formed in them, a plurality of source regions, each source region being formed in a corresponding body region, each source region including a plurality of first source regions each shaped in the form of a strip, each of the plurality of first source regions contacting a first side portion of the corresponding body region, and a second source region connecting the first source regions, a source electrode electrically connected to the source region, and a drain electrode electrically connected to the drain region.

Preferably, the at least two second side portions are not adjacent to each other.

The body region may comprise a plurality of first body regions contacting a surface of the drift region, being overlapped by the gate electrode, and contacting corresponding first source regions thereby form a plurality of channels, a plurality of second body regions contacting the surface of the drift region, being overlapped by the gate electrode, but not contacting any of the first source regions, a third body region contacting the surface of the drift region exposed by the opening, the third body region formed between the plurality of first source regions and directly contacting the plurality of second body regions, and a fourth body region connecting the first and the second source regions, wherein in the drift region, the fourth body region connects the first region, the second region and the third region to each other.

The impurity concentration of the plurality of second body regions and the third body region is preferably higher than that of the plurality of first body regions. Preferably, the plurality of second body regions are each parallel to corresponding second source regions.

The source electrode preferably contacts the second source region through a source contact. Preferably, the opening is tetragonal or hexagonal.

To achieve the second object, a method for manufacturing a power MOSFET is provided. This method comprises forming a drain region using a semiconductor substrate of a first conductivity type, forming a drift region on the drain region, the drift region having the same conductivity type as the drain region, forming a gate insulating layer on the drift region, the gate insulating layer having openings of a polygonal shape that partially expose the drift region, forming a gate electrode on the gate insulating layer, forming a body region of a second conductivity type in the drift region through ion implantation and diffusion processes using the gate electrode as a mask, and extending the body region into the drift region on all sides of the opening such that the gate electrode overlaps sides of the body region, forming a source region of the first conductivity type to form channels in fewer than all of the sides of the body region through ion implantation and diffusion processes using the gate electrode and the mask pattern as a mask, forming a source electrode to be electrically connected to the source region, and forming a drain region to be electrically connected to the drain region.

The mask pattern used for forming the source region preferably includes a first opening contacting at least two facing sides of the opening, spaced apart from other sides by a predetermined distance, and a second opening connecting the first openings to each other.

According to the present invention, a channel is formed only in the part of the body region along the side, so that the density of a parasitic bipolar transistor is reduced, to thereby increase the ruggedness of a device. Also, the channel is partially formed, so that even though the channel density is reduced, the ON-resistance of the device is barely increased, hence, there is no effect on the electrical characteristics of the device.

BRIEF DESCRIPTION OF THE DRAWINGS

The above objects and advantages of the present invention will become more apparent by describing in detail a preferred embodiment thereof, with reference to the attached drawings in which.

DESCRIPTION OF THE PREFERRED EMBODIMENTS

Figure 1:
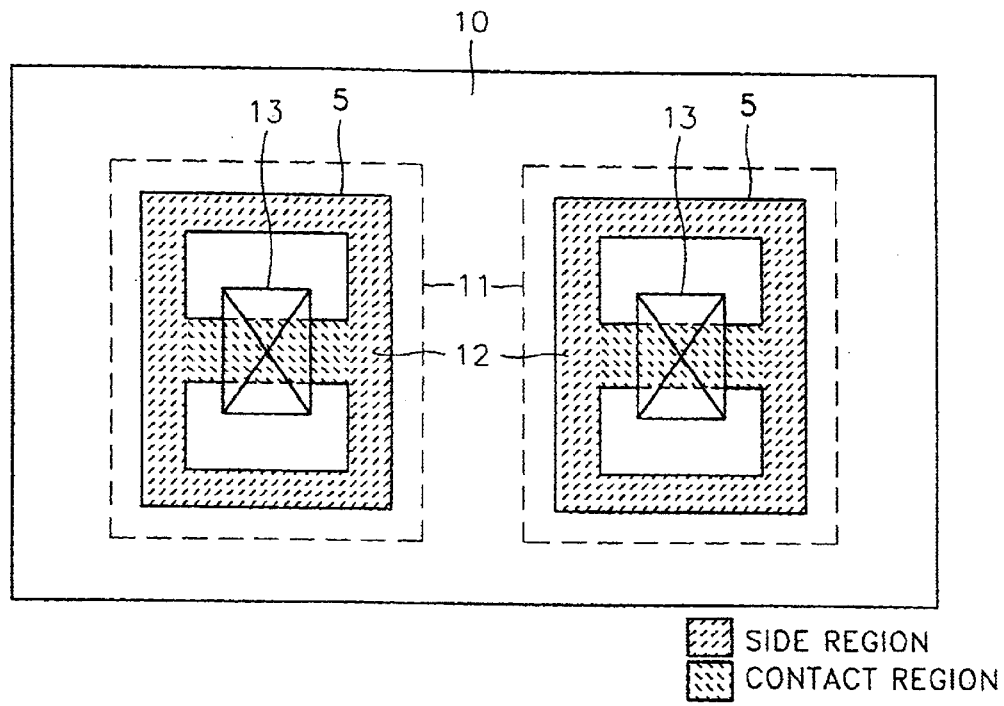
FIG. 1 shows a cell layout of a conventional power MOSFET.

The present invention will now be described more fully below with reference to the accompanying drawings, in which a preferred embodiment of the invention is shown. This invention may, however, be embodied in many different forms and should not be construed as limited to the embodiments set forth herein. Rather, this embodiments is provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present.

Figure 2:
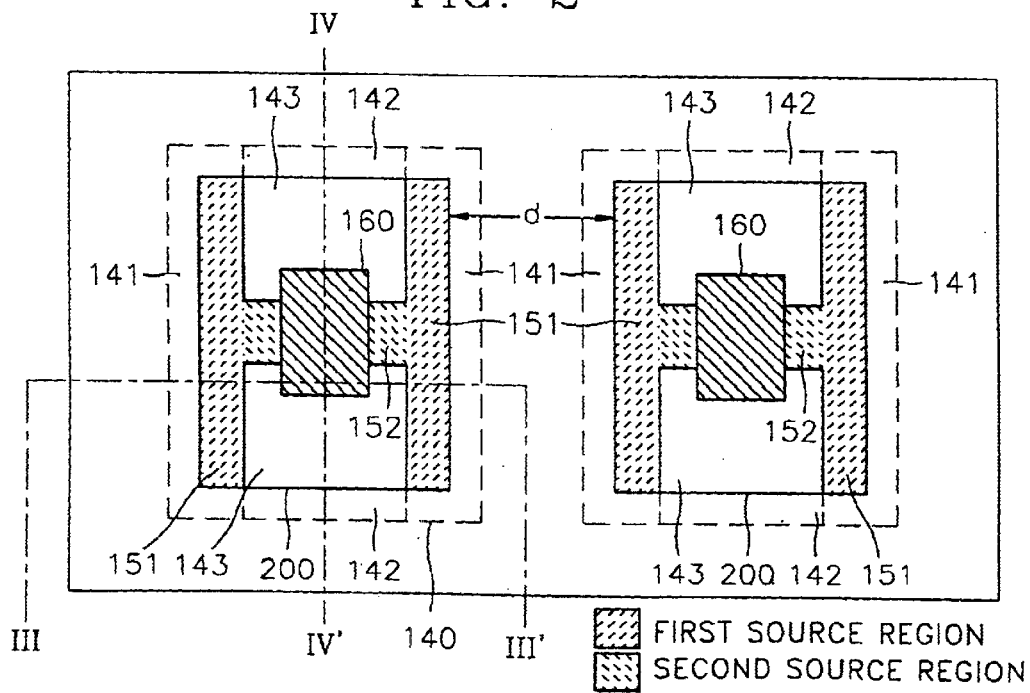
FIG. 2 shows a cell layout of a power MOSFET according to a preferred embodiment of the present invention.
Figure 3:
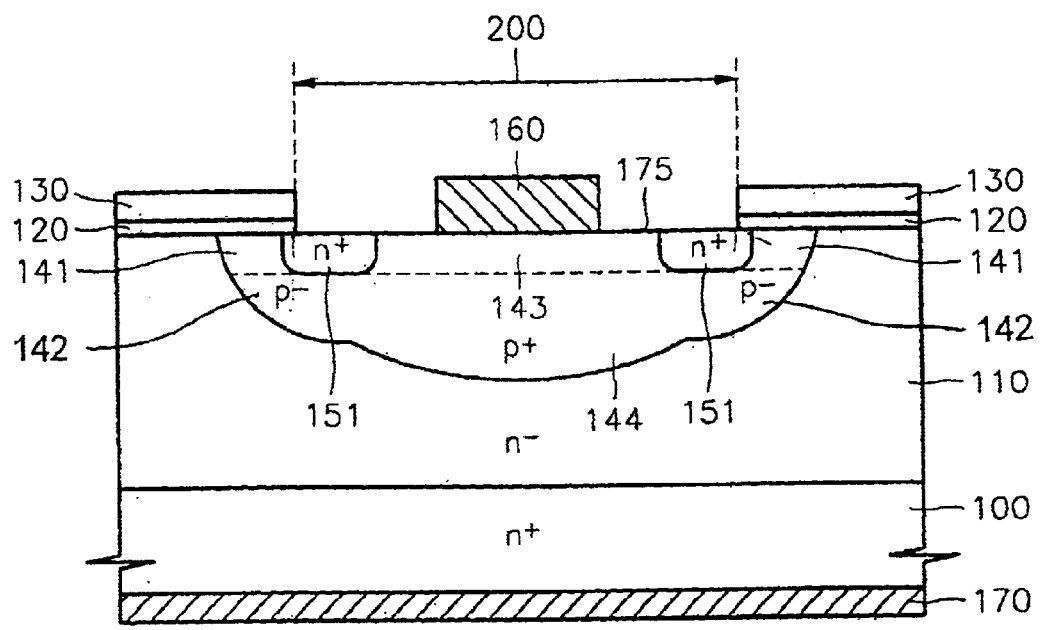
FIG. 3 is a sectional view of FIG. 2, taken along the line III–III'.
Figure 4:
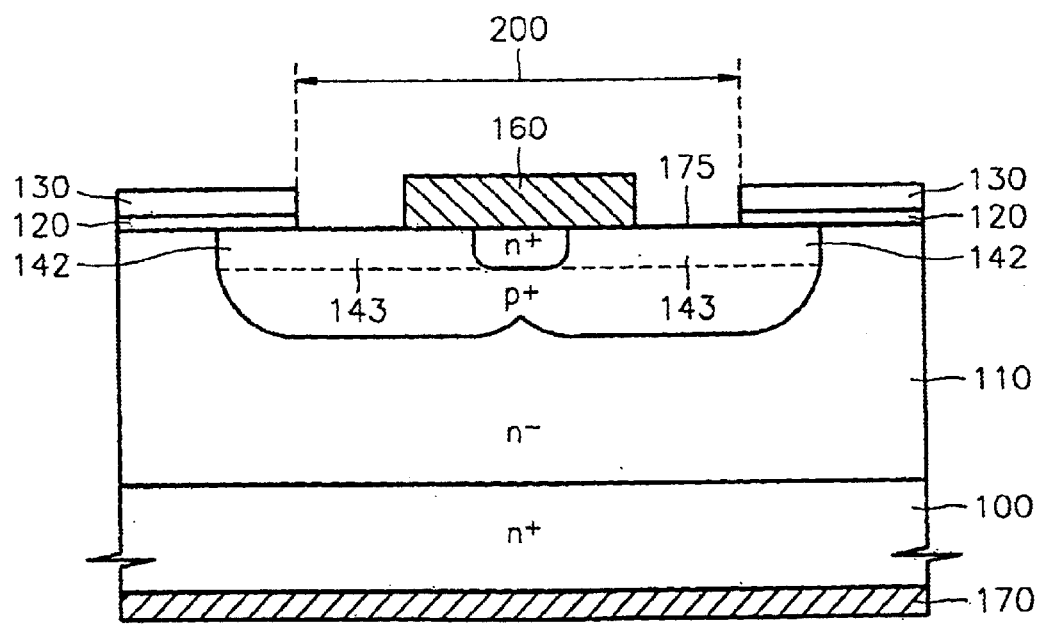
FIG. 4 is a sectional view of FIG. 2, taken along the line IV–IV'.

Referring to FIGS. 2 through 4, a power MOSFET according to a preferred embodiment of the present invention includes a plurality of adjacent cells, each having a drain region 100, a drift region 110, a gate insulating layer 120, a gate electrode 130, a body region 140, an n$^+$ type first source region 151, an n$^+$ type second source region 152, a source electrode 160, and a drain electrode 170.

The drift region 110 is arranged over the drain region 100 in the form of a semiconductor substrate heavily-doped with an impurity of a first conductivity type, e.g., an n-type impurity. The drift region 110 can be formed by epitaxial growth, and preferably has an impurity concentration lower than that of the drain region 100.

The gate electrode 130 is formed on the drift region 110, with the gate insulating layer 120 being interposed between the drift region 110 and the gate electrode 130. Each cell of the gate electrode 130 has an opening 200, and each opening 200 is spaced apart from the opening 200 of an adjacent cell by a predetermined distance d. The gate electrode 130 is preferably formed of a doped polysilicon layer. Openings 200, defined by the gate electrode 130, preferably have the shape of a polygon such as a tetragon or a hexagon. Tetragonal openings are used in the preferred embodiment of the present invention.

The body region 140 in each cell is defined by the openings 200, i.e., in the preferred embodiment it includes the inside of the tetragon indicated by the dotted lines. It is preferably doped with an impurity of a second conductivity type that is opposite to the first conductivity type, e.g., a p-type impurity, and is formed in an upper portion of the drift region 110. The body region 140 can be divided into four regions a first body region 141, a second body region 142, a third body region 143, and a fourth body region 144. Each cell preferably has two first body regions 141, two second body regions 142, one third body region 143, and one fourth body region 144.

The first body region 141 is a region where a channel is formed. As shown in FIG. 3, each first body region 141 contacts a surface 175 of the drift region 110 and is overlapped by the gate electrode 130. Preferably, the first body region has a low impurity concentration.

As shown in FIG. 4, the second body region 142 is a region without an n+-type source region. Each second body region 142 contacts the surface 175 of the drift region 110, and is also overlapped by the gate electrode 130, as with the first body regions 141.

As shown in FIGS. 3 and 4, the third body region 143 is a region contacting the surface 175 of the drift region 110 that is exposed by the opening 200. The third body region 143 is spaced apart from the first body region 141 by a predetermined distance and directly contacts the second body region 142. The impurity concentration of the third body region 143 is preferably high like the impurity concentration of the second body region 142.

The fourth body region 144 is a region connecting the first, second and third body regions 141, 142, and 143 to each other in the drift region 110.

The n+ type first source region 151 is arranged between the first body region 141 and the third body region 143. In the preferred embodiment there are two first body regions in each cell, so each cell also has two n+ type first source regions 151. The first source region 151 is preferably formed only between the first body region 141 and the third body region 143, but is not formed between the second body region 142 and the third body region 143. As a result, a parasitic bipolar transistor exists in the first body region 141 but not in the second body region 142. Thus, the density of the parasitic bipolar transistor is lowered and the ruggedness of the device is increased.

The n+ type second source region 152 connects the two first source regions 151 in each cell, and is connected with a source electrode 160 in a contact area.

As a result of this configuration, an emitter ballasting effect is generated from the first source region 151 so that an electric potential between the first body region 141 and the first source region 151 can be reduced, to thereby suppress latch-up due to the parasitic bipolar transistor. A current path moving in the first source region 151 is serial, which is different from the conventional current path, so that the emitter ballasting effect is remarkably increased.

The source electrode 160 is formed to be electrically connected to the second source region 152, and electrically connected to the first source region 151 through the second source region 152.

The drain electrode 170 is formed to be electrically connected to the drain region 100.

According to the power MOSFET of the present invention, the density of the parasitic bipolar transistor is reduced to increase the ruggedness of the device, and to reduce the channel density. Reduction in the channel density primarily effects the on-resistance. When the channel density is reduced, the on-resistance of the device is similarly reduced. The on-resistance of the device is composed of a variety of resistance components in a transistor. For instance, the on-resistance of the device may be the sum of the channel resistance, the accumulation resistance, the JFET resistance, and the drift resistance. However, the effect of the various resistance components on the on-resistance of the device varies according to the rated voltage of the device.

Figure 5:
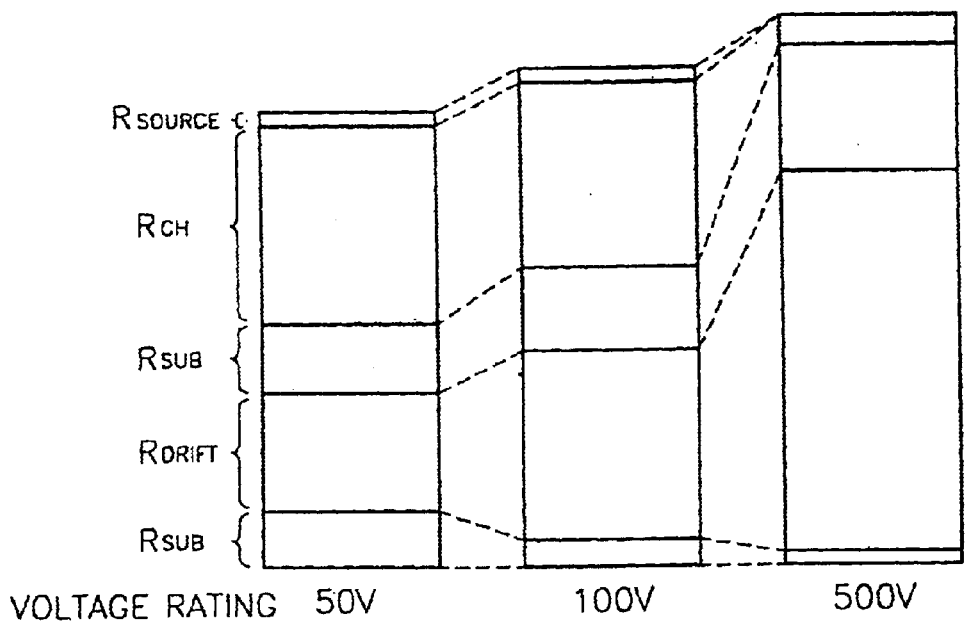
FIG. 5 is a graph showing the effect of internal resistance components of a power MOSFET device on the device's on-resistance according to a preferred embodiment of the present invention.

Referring to FIG. 5, when the rated voltage of a device is approximately 50V, the on-resistance of the device depends primarily on the channel resistance $R_{CH}$. When the rated voltage of the device is approximately 100V, the on-resistance of the device depends primarily on a combination of the channel resistance $R_{CH}$ and the drift resistance $R_{DRIFT}$. In other words, when the rated voltage of the device rises to about 100V, the channel resistance $R_{CH}$ is slightly reduced, the drift resistance $R_{DRIFT}$ is greatly increased, and other resistance components, such as substrate resistance $R_{SUB}$, JFET resistance $R_{JFET}$ and source resistance $R_{SOURCE}$, are only slightly effected. When the rated voltage of a device is approximately 500V, the on-resistance of the device depends primarily upon the drift resistance $R_{DRIFT}$, and the channel resistance $R_{CH}$ has little effect on the on-resistance of the device.

Thus, according to the power MOSFET of the present invention, even though the channel density is reduced to increase the channel resistance, the on-resistance of the device is seldom increased, which maintains the electrical characteristics of the device.

Another characteristic of the present invention is that it does not limit the impurity concentration of the second body region 142. In other words, the second body region 142 requires no channel, so that the characteristics of the device are not degraded even though the impurity concentration is maintained at a high level. Thus, according to the MOSFET of this embodiment of the present invention, the impurity concentration of the second body region 142 is as high as the impurity concentration in the third body region 143. This has the same effect as if the third body region 143 were expanded. The advantages will now be described with reference to FIG. 6.

Figure 6:
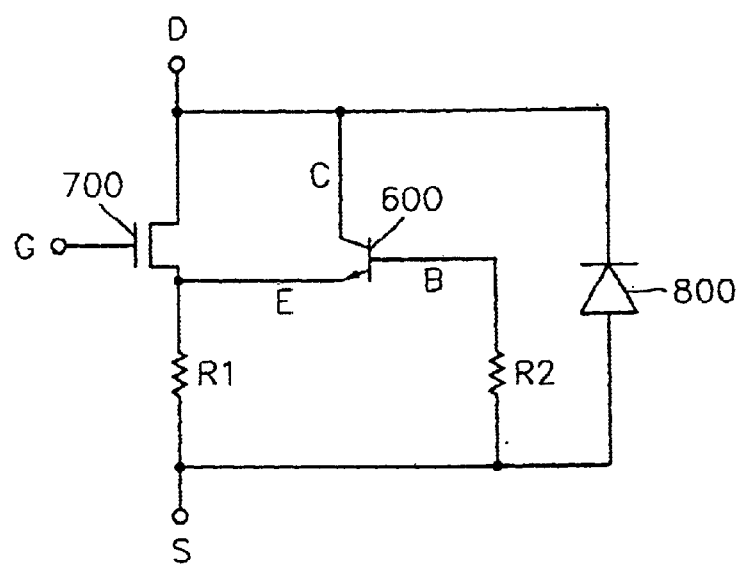
FIG. 6 is an equivalent circuit diagram of the power MOSFET of FIG. 4.

FIG. 6 shows a parasitic bipolar transistor 600, a MOS transistor 700, and a diode 800. The MOS transistor is described above with reference to FIGS. 2–4. The parasitic bipolar transistor 600 is an npn transistor. In the parasitic bipolar transistor 600, the source regions 151/152 form an emitter terminal E, and the body regions 141/142/143/144 and the drift region 110 form the base B and collector C.

The diode 800 is formed between the body regions 142/143/144 acting as an anode, and the drift region 110 acting as the cathode.

Referring to FIG. 6, the collector terminal C of the parasitic bipolar transistor 600 is connected to a drain terminal D through drift/drain regions 110 and 100 of FIGS. 3 and 4 of a power MOSFET 700, the emitter terminal E is connected to a source terminal S through the first source region 151 of FIGS. 2 through 4 and an emitter ballasting resistance $R_1$ of the first source region 151, and the base terminal B is connected to the source terminal S through the body region 140 of FIGS. 2 through 4 and the resistance $R_2$ of the body region 140. Meanwhile, the diode 800 is formed between the source terminal S and the drain terminal D, and has the source terminal S as an anode and the drain terminal D as a cathode.

The diode 800 is used for emitting energy stored in an external inductor load when the MOS transistor 700 performs a switching operation. Thus, the capacitance of the diode 800 has a great effect on the stability of the device. For instance, when the reverse current of the MOSFET is insufficiently drained because of a small capacitance of the diode 800, the device may be damaged. According to the present invention, the effect is the same as that of the case in which the third body region 143 connected to the anode terminal of the diode 800 extends to the second body region 142, so that the reverse current through the diode 800 is sufficiently drained. This has the effect of improving the stability of the device.

The diode 800 is formed between the third body region 143 and the fourth body region 144, and the drift region 110. Simultaneously, the diode 800 is formed between the second body region 142 and the fourth body region 144, and the drift region 110. As a result, the capability of the diode 800 will be increased.

Meanwhile, a method for manufacturing the power MOSFET according to the preferred embodiment of the present invention will be described with reference to FIGS. 2–4 and 7–15.

A drain region 100 is formed using a semiconductor substrate of a first conductivity type, e.g., an n-type. Subsequently, a drift region 110 is formed on the drain region 100, where the conductivity types of the drift region 110 and the drain region 100 are preferably the same. The drift region 110 can be formed using epitaxial growth.

Then, a gate insulating layer 120 is formed on a surface 175 of the drift region 110, and a gate electrode 130 is formed on the gate insulating layer 120. This is accomplished by having an insulating layer and a gate conductive layer (not shown) sequentially formed on the surface of the drift region 110, and then patterning the resultant structure, including the insulating layer and the gate conductive layer, to form the gate insulating layer 120 and the gate electrode 130. The gate insulating layer 120 and the gate electrode 130 are formed to have openings 200 of a polygon shape that expose the surface 175 of the drift region 110.

Figure 7:
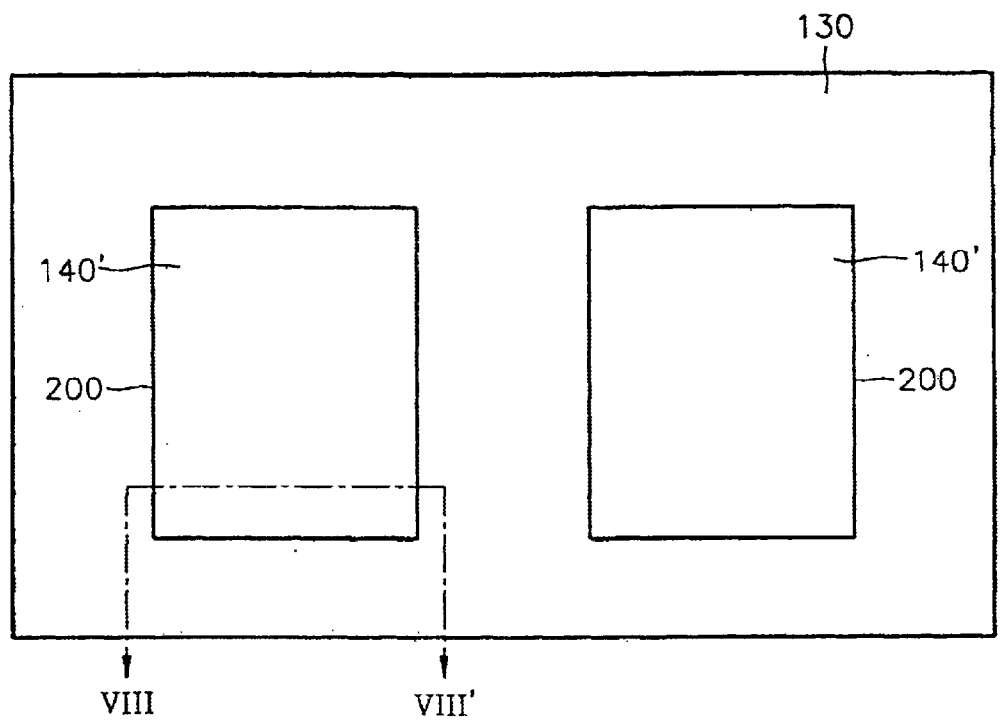
FIG. 7 is an overhead view of a power MOSFET during creation of the body region, according to a preferred embodiment of the present invention.
Figure 8:
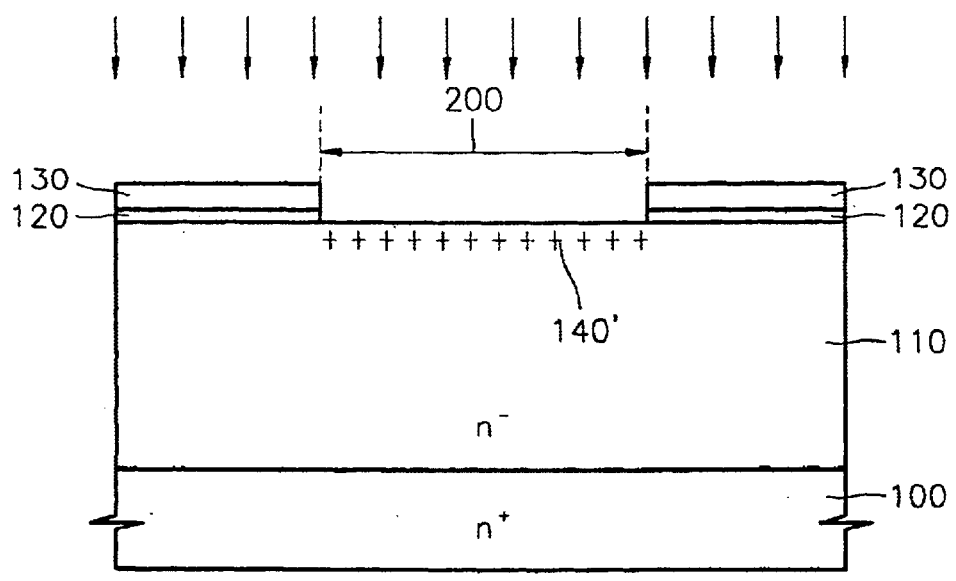
FIG. 8 is a sectional view of FIG. 2, taken along the line VIII–VIII'.

Then, as shown in FIGS. 7 and 8, a first impurity region 140' of a second conductivity type, e.g., a p-type, is formed in the drift region 110 by ion implantation using the gate electrode 130 as a mask. The resulting first impurity region 140' is formed in a predetermined upper region of the drift region 110 and extends over the entire opening 200, and under the gate electrode 130 on all sides. Because of this, all of the edge portions of the resulting body region 140 will be overlapped by the gate electrode 130 after a diffusion process.

Figure 9:
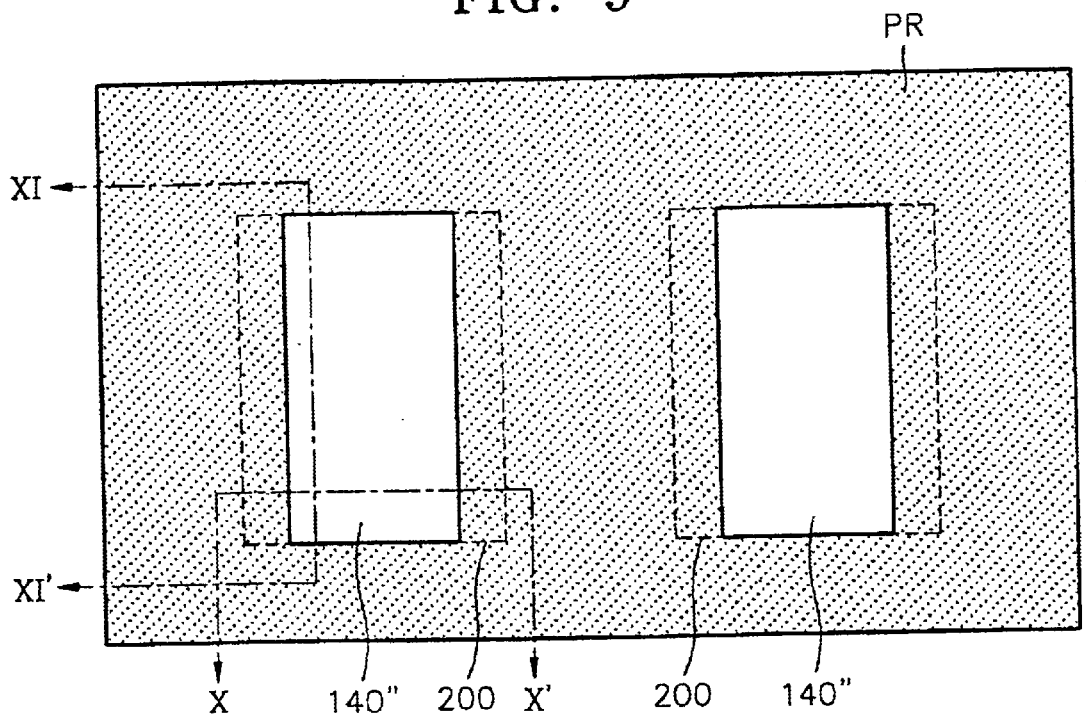
FIG. 9 is an overhead view of a power MOSFET during creation of the body region, according to a preferred embodiment of the present invention.
Figure 10:
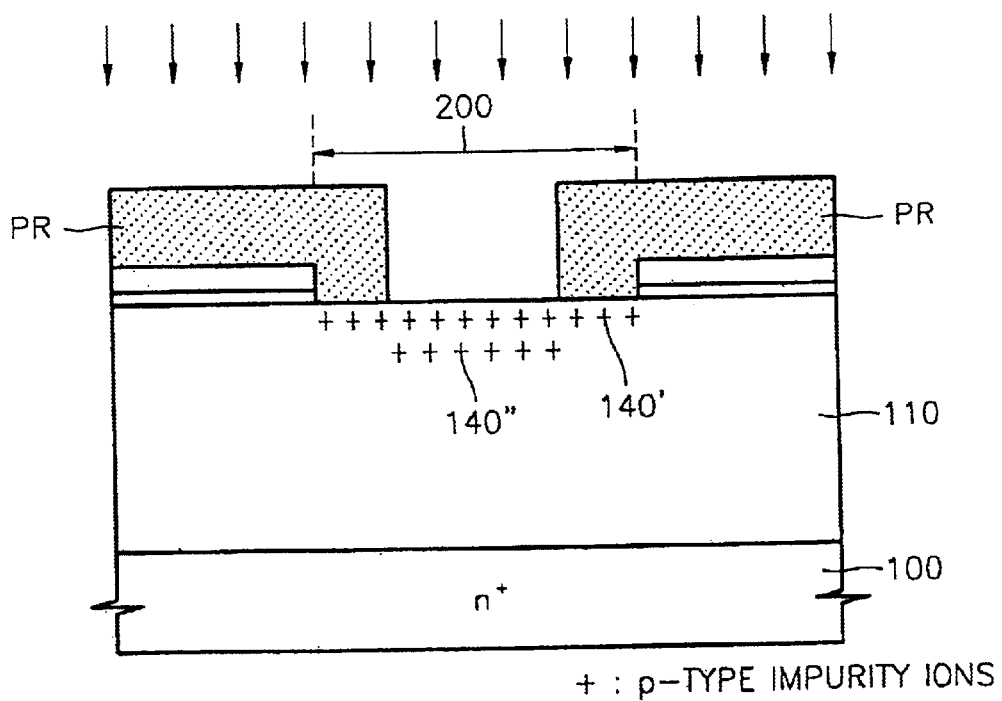
FIG. 10 is a sectional view of FIG. 9, taken along the line X–X'.
Figure 11:
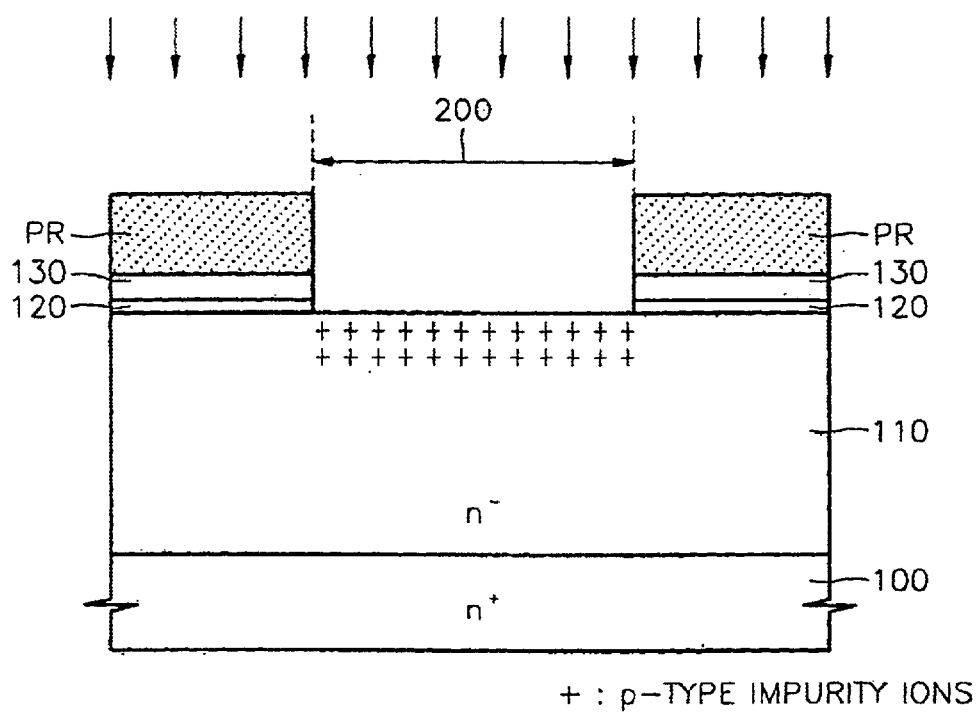
FIG. 11 is a sectional view of FIG. 9, taken along the line XI–XI'.

As shown in FIGS. 9 to 11, a photoresist layer pattern PR is then formed over the gate electrode 130 and a portion of the opening 200. As can be seen from FIG. 9, the photoresist layer pattern PR exposes the entire length of the opening 200, but only a portion of the width of the opening 200. FIG. 10 shows a cross-section of the length of the opening 200, while FIG. 11 shows a cross-section of the width of the opening 200.

Using the photoresist layer pattern PR as a mask, a second impurity region 140" of a high concentration second conductivity type, e.g., a p+-type, is then formed in the exposed portion of the drift region 110 by ion implantation.

Figure 12:
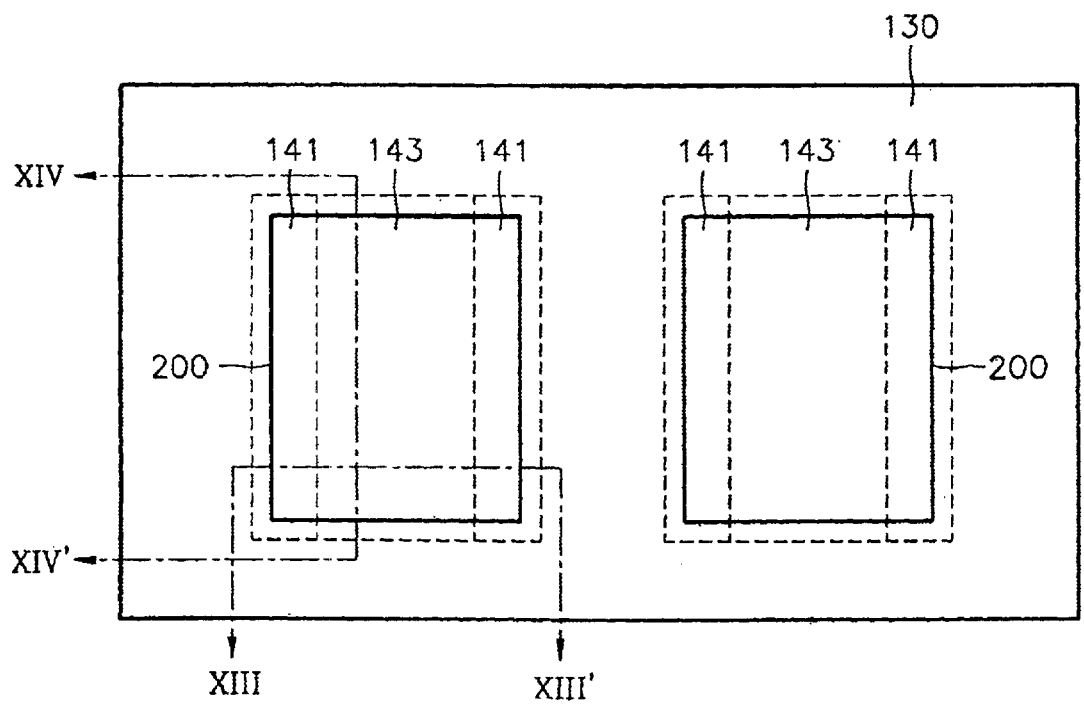
FIG. 12 is an overhead view of a power MOSFET during diffusion of the body region, according to a preferred embodiment of the present invention.
Figure 13:
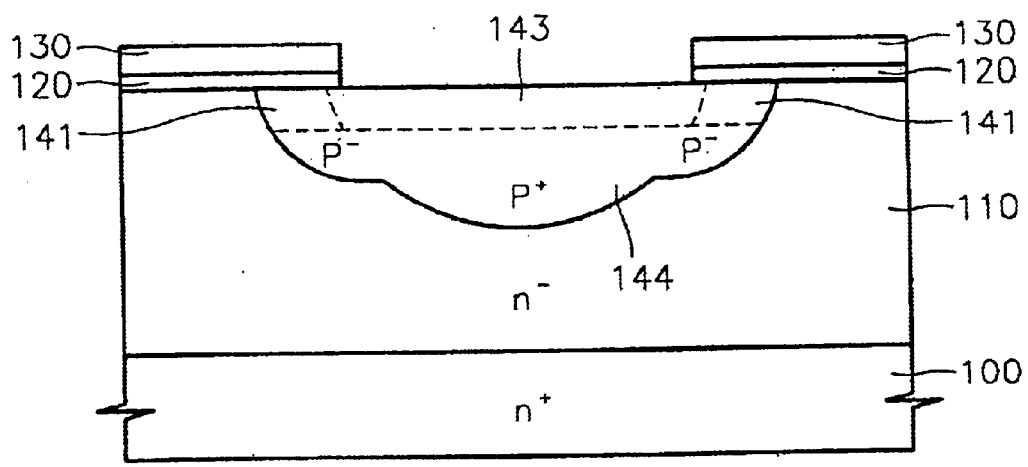
FIG. 13 is a sectional view of FIG. 12, taken along the line XIII–XIII'.
Figure 14:
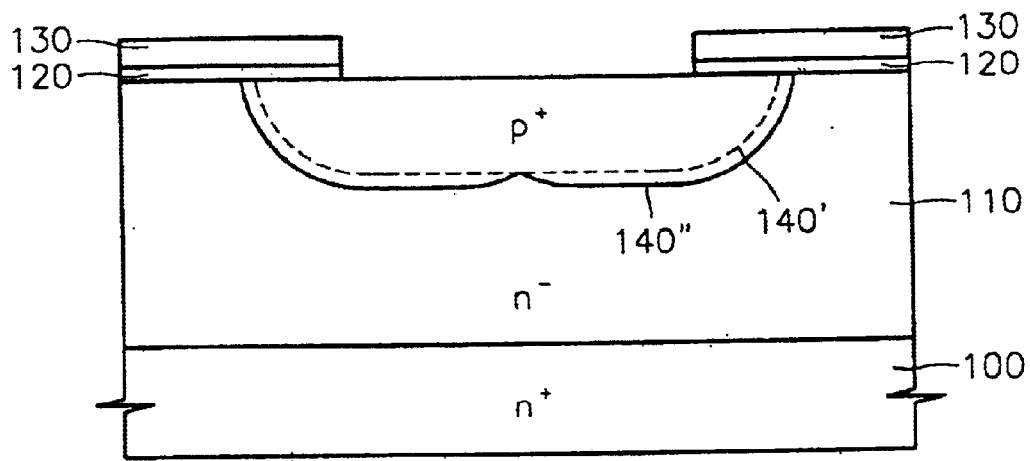
FIG. 14 is a sectional view of FIG. 12, taken along the line XIV–XIV'.

As shown in FIGS. 12 to 14, the photoresist layer pattern PR is then removed, and a diffusion process is performed to diffuse the implanted ions from the first and second impurity regions 140' and 140" into the drift region 110 to form the first through fourth body regions 141, 142, 143, and 144.

Figure 15:
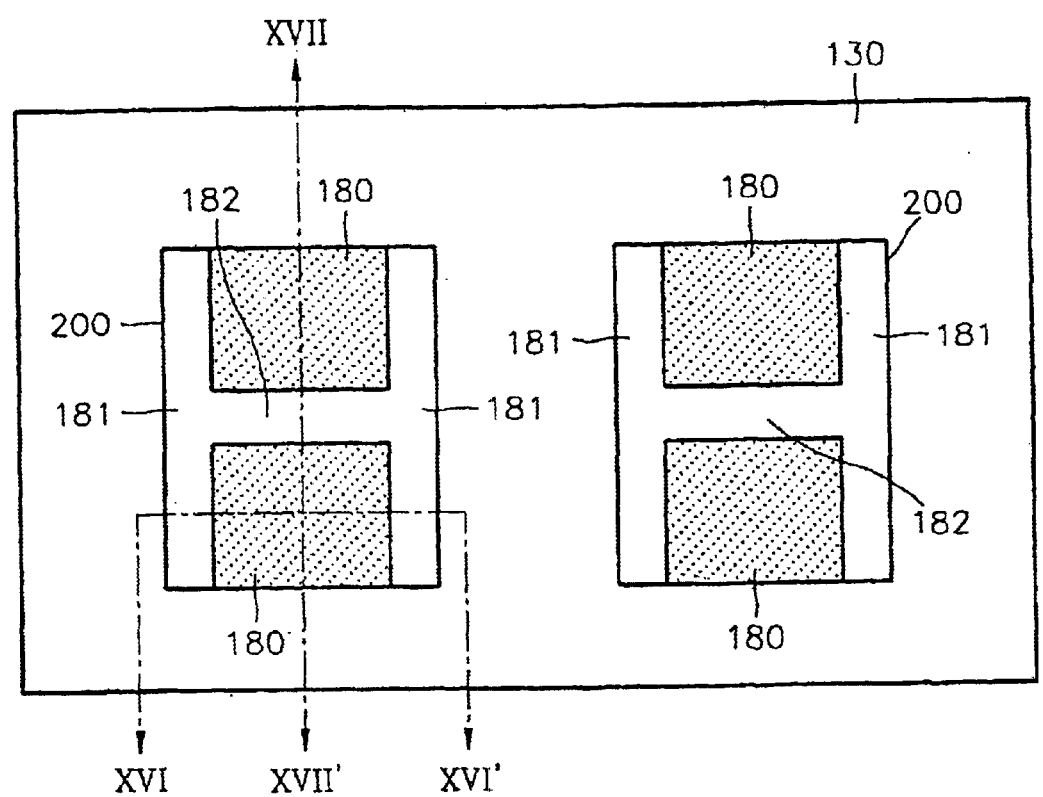
FIG. 15 is an overhead view of a power MOSFET during creation of the source region, according to a preferred embodiment of the present invention.
Figure 16:
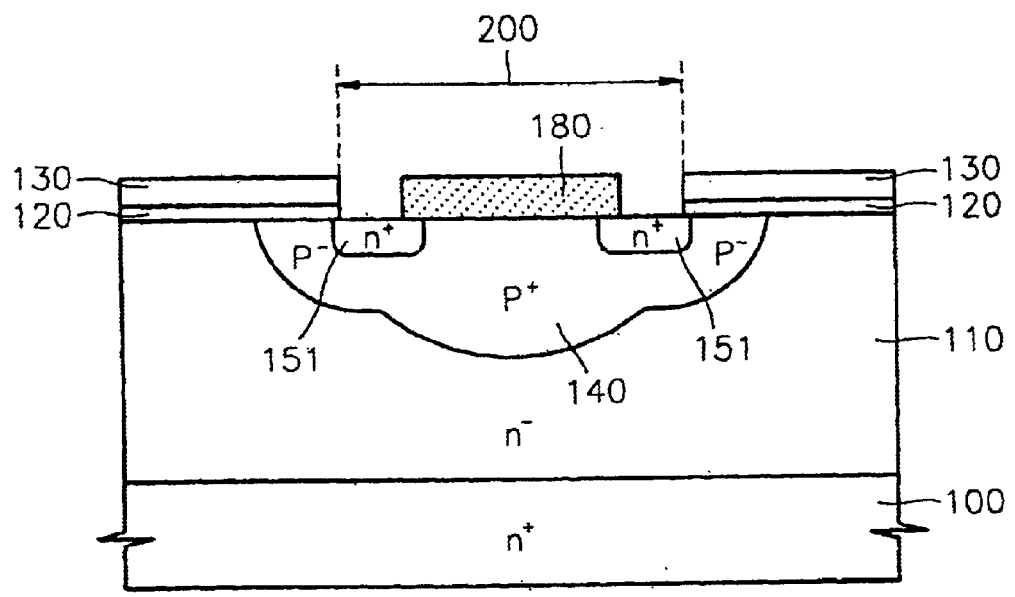
FIG. 16 is a sectional view of FIG. 15, taken along the line XVI–XVI'.
Figure 17:
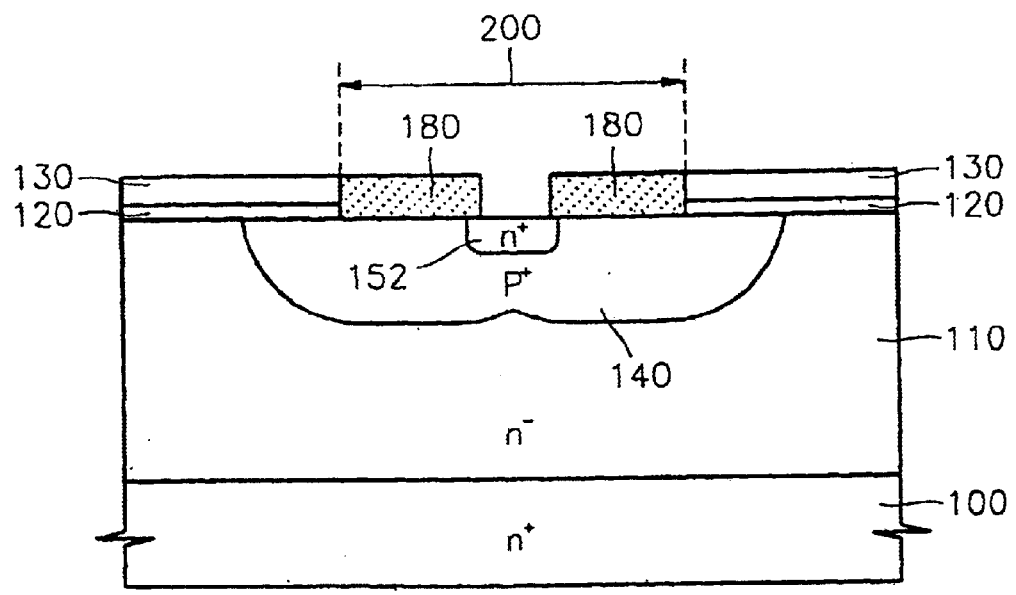
FIG. 17 is a sectional view of FIG. 15, taken along the line XVII–XVII'.

As shown in FIGS. 15 to 17, a mask 180 is then formed in each of the openings 200. The first and second source regions 151 and 152 are then formed simultaneously, preferably by ion implantation and diffusion processes, using the gate electrode 130 and a mask pattern 180 as a mask. The mask pattern 180 preferably includes a first opening 181 contacting at least two facing sides of the opening 200, and is preferably spaced apart from other sides by a predetermined distance, and a second opening 152 connecting the first openings to each other. The first source regions 151 are formed through the first opening 181, and the second source region 152 is formed through the second opening 182.

The source electrode 160 is then formed through a source contact connected to the second source region 152, and the drain electrode 170 is electrically connected to the drain region 100, to thereby complete the power MOSFET according to the preferred embodiment of the present invention.

What is claimed is:

1. A power MOSFET comprising:
    a drain region formed of a semiconductor substrate of a first conductivity type;
    a drift region formed on the drain region, having the same conductivity type as the drain region;
    a gate insulating layer on the drift region, having a plurality of openings spaced apart from each other by a predetermined distance, the plurality of openings partially exposing the drift region;
    a gate electrode formed on the gate insulating layer and having a plurality of openings which are aligned with the openings of the gate insulating layer;
    a plurality of body regions of a second conductivity type, each body region being formed in the drift region beneath a corresponding opening, and each body region having first portion coincident with the corresponding opening and a plurality of side portions surrounding the first portion and overlapped by the gate electrode, wherein the plurality of side portions include at least two first side portions have a channel formed in them, and at least two second side portions do not have a channel formed in them;
    a plurality of H-shaped source regions, each H-shaped source region being formed in a corresponding body region, each H-shaped source region including
        a plurality of first source regions each shaped in the form of a strip, each of the plurality of first source regions contacting one of said first side portions of the corresponding body region, and
        a second source region connecting the first source regions;
    a source electrode electrically connected to the source region; and
    a drain electrode electrically connected to the drain region.

2. A power MOSFET, as recited in claim 1, wherein the at least two second side portions are not adjacent to each other.

3. A power MOSFET, as recited in claim 1, wherein the body region comprises:
    a plurality of first body regions contacting a surface of the drift region, being overlapped by the gate electrode, and contacting corresponding first source regions thereby form a plurality of channels;
    a plurality of second body regions contacting the surface of the drift region, being overlapped by the gate electrode, but not contacting any of the first source regions;
    a third body region contacting the surface of the drift region exposed by the opening, the third body region formed between the plurality of first source regions and directly contacting the plurality of second body regions; and
    a fourth body region connecting the first and the second source regions, wherein in the drift region, the fourth body region connects the first region, the second region and the third region to each other.

4. A power MOSFET, as recited in claim 3, wherein the impurity concentration of the plurality of second body regions and the third body region is higher than that of the plurality of first body regions.

5. A power MOSFET, as recited in claim 3, wherein the plurality of second body regions are each parallel to corresponding second source regions.

6. A power MOSFET, as recited in claim 1, wherein the source electrode contacts the second source region through a source contact.

7. A power MOSFET, as recited in claim 1, wherein each of the plurality of openings of the gate insulating layer is tetragonal.

8. A power MOSFET, as recited in claim 1, wherein each of the plurality of openings of the gate insulating layer is hexagonal.

9. A power MOSFET comprising:
  a drain region of a first conductivity type;
  a drift region of the first conductivity type formed over said drain region;
  a gate insulating layer formed over the drift region, the gate insulating layer having a polygonal opening defined therein, wherein the polygonal opening defines and overlaps a polygonal surface region of the drift region;
  a gate electrode formed on the gate insulating layer and having a polygonal opening defined therein which is aligned with the polygonal opening of the gate insulating layer and the polygonal surface region of the drift region;
  a body region of a second conductivity type formed in the drift region, the body region having a first portion formed in the polygonal surface region of the drift region, and a second portion surrounding the first portion, wherein the gate insulating layer and the gate electrode surround the first portion of the body region and overlap the second portion of the body region, and wherein an interface between the first portion and the second portion of the body region is aligned with the polygonal opening in the insulating layer and gate electrode;
  first and second stripped source regions extending lengthwise in the body region along opposite sides of the interface between the first portion and the second portion of the body region, respectively, wherein respective channels are defined in the second portion of the body region adjacent the first and second stripped source regions, respectively, and wherein no other channels are defined in the second portion of the body region;
  a source connecting region formed in the body region and connected to the first and second stripped source regions to define an H-shape source region containing the first and second stripped source regions and the source connecting region.

10. A power MOSFET, as recited in claim 9, wherein said some of the sides of the interface between the first and second portions of the body region are not adjacent to each other.

11. A power MOSFET as recited in claim 9, wherein the polygonal surface region is a tetragonal surface region such that the interface between the first and second portions of the body region is defined by first, second, third and fourth sides, wherein the first and third sides are opposite one another and the second and fourth sides are opposite one another, and wherein the stripped source regions extend parallel to each other along the first and third sides of the interface, and wherein the remaining second and fourth sides of the interface are devoid of source regions.

* * * * *